US007989045B2

(12) United States Patent
Chang

(10) Patent No.: US 7,989,045 B2

(45) Date of Patent: Aug. 2, 2011

(54) ELASTIC SHEET STRUCTURE AND ARRAY TYPE ELASTIC SHEET DEVICE USING THE SAME

(75) Inventor: Cheng-Lung Chang, Tu-Cheng (TW)

(73) Assignee: Chi Mei Communication Systems, Inc., Tu-Cheng, New Taipei (TW)

( * ) Notice: Subject to any disclaimer, the term of this patent is extended or adjusted under 35 U.S.C. 154(b) by 640 days.

(21) Appl. No.: 12/106,542

(22) Filed: Apr. 21, 2008

(65) Prior Publication Data

US 2009/0110876 A1 Apr. 30, 2009

(30) Foreign Application Priority Data

Oct. 31, 2007 (CN) .......................... 2007 1 0202350

(51) Int. Cl.
*H05K 9/00* (2006.01)
*H01R 12/00* (2006.01)
*B32B 3/06* (2006.01)

(52) U.S. Cl. .......... 428/98; 174/366; 361/801; 361/818; 428/99; 428/119; 439/66

(58) Field of Classification Search .................... 428/98, 428/99, 119; 361/801, 818; 174/35 GC, 174/35 R; 439/66
See application file for complete search history.

(56) References Cited

U.S. PATENT DOCUMENTS 5,833,480 A * 11/1998 Austin ............................ 439/95
6,359,215 B1 * 3/2002 Horng ............................ 174/367
2002/0105790 A1 * 8/2002 Naruse et al. ................. 361/784

* cited by examiner

*Primary Examiner* — David R Sample
*Assistant Examiner* — Brent T O'Hern
(74) *Attorney, Agent, or Firm* — Zhigang Ma

(57) ABSTRACT

An elastic sheet structure including a fixing section, a body section perpendicularly connected to the fixing section, an elastic section, and two support sections is provided. The elastic section perpendicularly connects to the body section so that a portion of the elastic section is substantially parallel to the fixing section. Two support sections perpendicularly connect to two opposite sides of the body section. The support sections are supported by the fixing section, and are higher than the body section concurrently with respect to the fixing section. The elastic section is located between and movable with respect to the two support sections, and a top of the elastic section is higher than a top of each support section concurrently with respect to the fixing section. Further, an array type elastic sheet device using the elastic sheet structure is also provided.

9 Claims, 11 Drawing Sheets

130

ELASTIC SHEET STRUCTURE AND ARRAY TYPE ELASTIC SHEET DEVICE USING THE SAME

BACKGROUND OF THE INVENTION

1. Field of the Invention

The present invention relates to a conductive contact, particularly to an elastic sheet structure and an array type elastic sheet device equipped with the elastic sheet structure.

2. Discussion of the Related Art

Electronic products often are equipped with elastic sheet structures. The elastic sheet structure is for providing electrical conductivity for conductive components of electronic products. For example, an elastic sheet structure is provided between electronic components and a circuit board so as to electrically connect the electrical components to the circuit board. The elastic sheet structure is also for providing ground connection between two circuit boards or between a circuit board and electronic components arranged thereon so as to eliminate the potential difference therebetween. In addition, for some electronic products incorporating a metallic housing for shielding the electronic components arranged on a circuit board from electromagnetic interference, the elastic sheet structures are equipped to provide ground connection between the metallic housing and the circuit. In this way, the potential difference at different grounding points between the housing and the electronic components on the circuit is also eliminated. Therefore, the elastic sheet structure not only provides ground connections for electronic products but also serves as a protection shield of the electronic components from electromagnetic interference.

Generally, elastic sheet structures are C-shaped metal sheets. The bottom of the C-shaped metal sheet is fixed on a circuit board, and a component to be electrically connected is mounted on the top of the C-shaped metal sheet. However, such elastic sheet structures are not durable for the reason that the elastic sheet structure may be permanently deformed by the component and lose elasticity thus degrading or ruining electrical continuity thereof. Further, the conventional elastic sheet contains only one elastic section, which provides only one contact point for electrical continuity, therefore a single failure of the lone elastic section may disable an electronic component using the elastic sheet.

Therefore, an improved elastic sheet structure and an improved array type elastic sheet device is desired in order to overcome the above-described problems.

SUMMARY OF THE INVENTION

In one aspect, an elastic sheet structure including a fixing section, a body section perpendicularly connected to the fixing section, an elastic section, and two support sections is provided. The elastic section perpendicularly connects to the body section so that a portion of the elastic section is substantially parallel to the fixing section. Two support sections perpendicularly connects to two opposite sides of the body section. The support sections are supported by the fixing section, and are higher than the body section concurrently with respect to the fixing section. The elastic section is located between and movable with respect to the two support sections, and a top of the elastic section is higher than a top of each support section concurrently with respect to the fixing section.

Other advantages and novel features of the present elastic sheet structure will become more apparent from the following detailed description when taken in conjunction with the accompanying drawings.

BRIEF DESCRIPTION OF THE DRAWINGS

Many aspects of the elastic sheet structure can be better understood with reference to the following drawings. The components in the drawings are not necessarily to scale, the emphasis instead being placed upon clearly illustrating the principles of the present elastic sheet structure. Moreover, in the drawings, like reference numerals designate corresponding parts throughout the several views, in which.

DETAILED DESCRIPTION OF THE EMBODIMENTS

Figure 1:
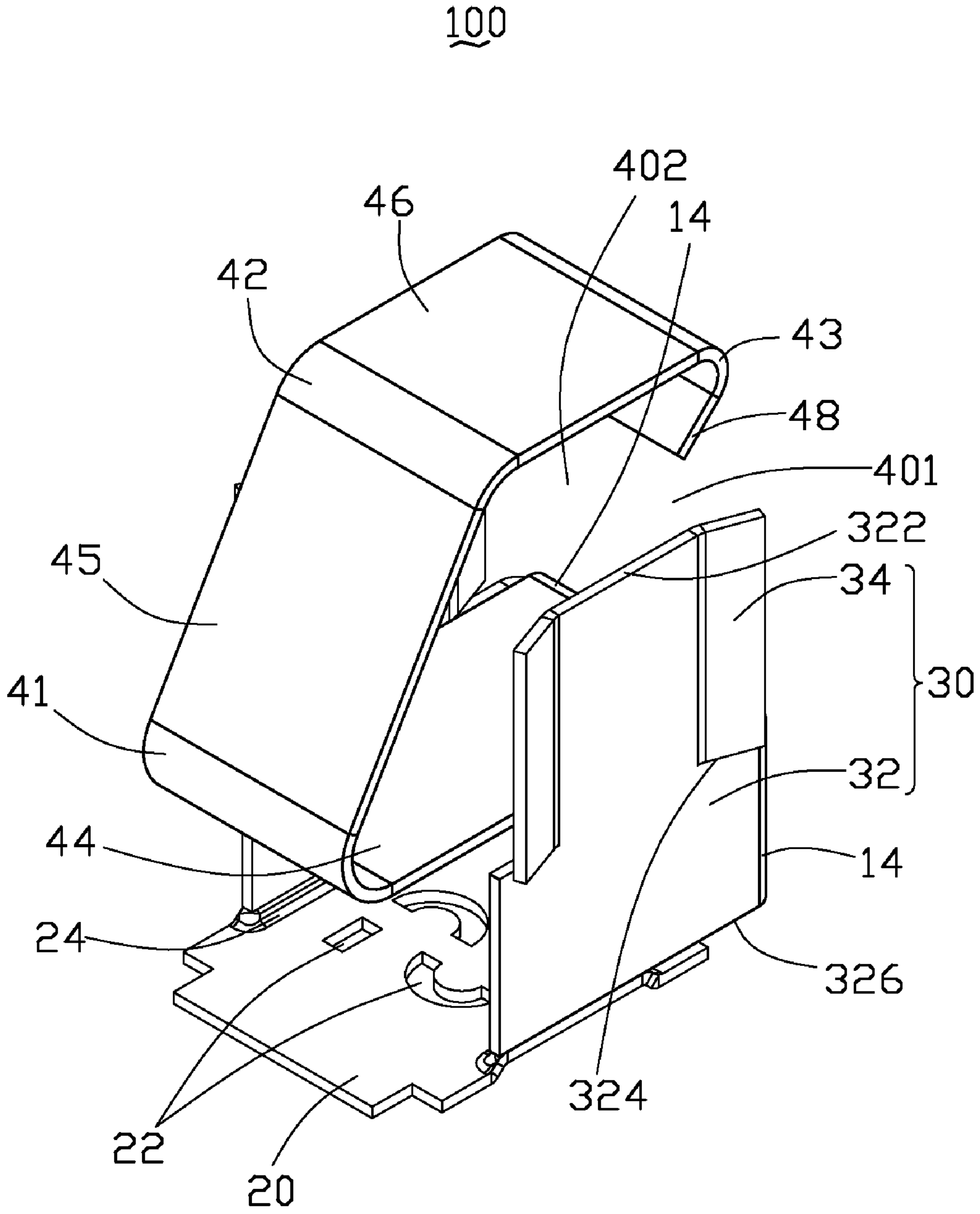
FIG. 1 is a perspective schematic view of an elastic sheet structure according to a preferred embodiment.
Figure 2:
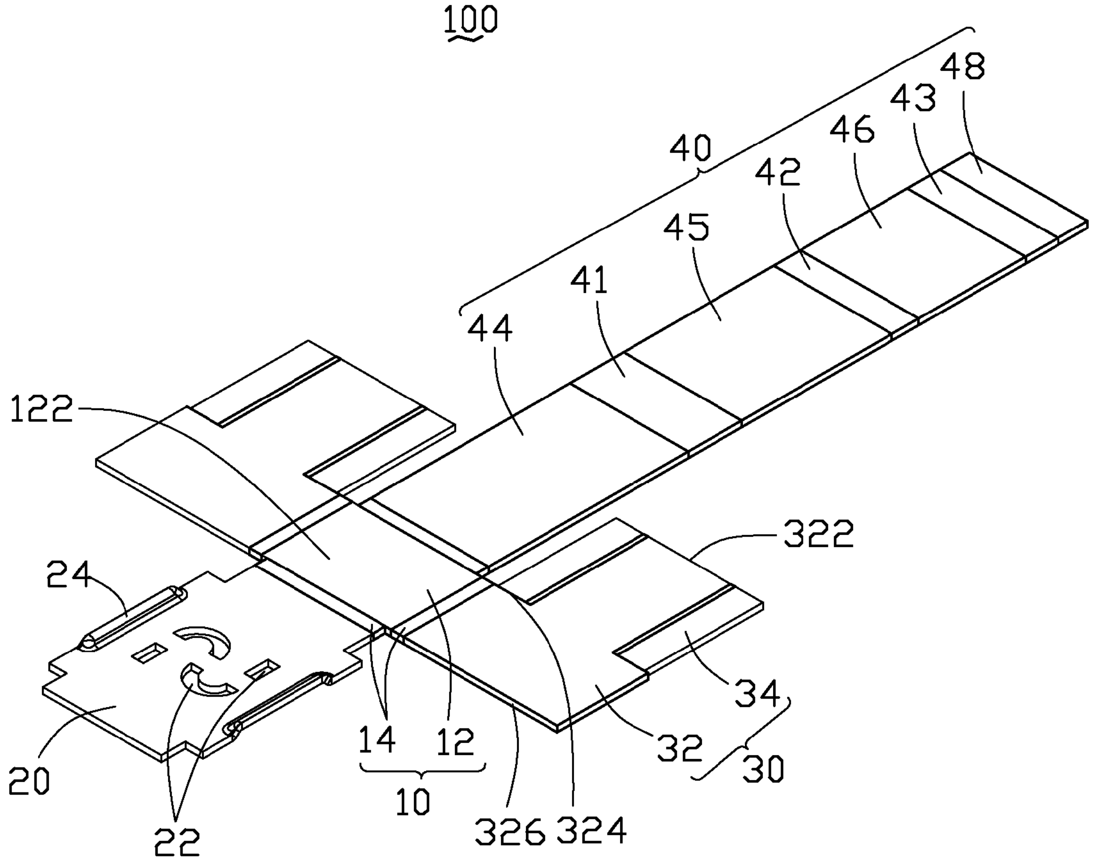
FIG. 2 is a stretched-out schematic view of the elastic sheet structure of FIG. 1 before it is bent to a finalized shape.

Referring to FIG. 1 and FIG. 2, an elastic sheet structure 100 according to a first embodiment and a stretched-out, semi-finalized product view thereof are shown. The elastic sheet structure 100 is adapted to provide electrical connection between electronic components and a circuit board of an electronic device (not shown). The elastic sheet structure 100 is formed by punching and bending a sheet of metallic material. FIG. 2 is the stretched-out view of FIG. 1, before the elastic sheet structure 100 is bent to its finalized shape. The elastic sheet structure 100 includes a fixing section 20, a body section 10 perpendicularly connected to the fixing section 20, two support sections 30, and an elastic section 40. The body section 10 includes a rectangular body 12 and four bending edges 14 extending from four edges of the rectangular body 12. The rectangular body 12 includes a first surface 122. Each of the bending edges 14 has a rectangular-plate shape (FIG. 2) when the elastic sheet structure 100 is stretched-out, and has an arc-plate shape (FIG. 1) when the elastic sheet structure 100 is bent. One pair of the opposite ends of the rectangular body 12 respectively connects the fixing section 20 and the elastic section 40 via the bending edges 14. The other pair of the opposite ends of the rectangular body 12 respectively connects the two support sections 30 via the bending edges 14. The fixing section 20 is substantially rectangular-shaped, and defines a plurality of fixing slots 22 therein. The fixing slots 22 include a plurality of arc-shaped slots and rectangular-shaped slots, which cooperatively form a fixing slots pattern. In the embodiment, the fixing section 20 is fixed on the circuit board by welding solder poured into the fixing slots 22. Two bulges 24 are formed on two opposite sides of the fixing section 20 by punching a bottom of the metal sheet with molds. The four corners of the fixing section 20 are cut out to be L-shaped corner by punching.

The two support sections 30 are substantially rectangular-shaped. The support sections 30 are connected to the body section 10 by a pair of opposite bending edges 14. Each of the support section 30 includes a substantially inverted T-shaped body 32 and two wings 34 integrally formed with the inverted T-shaped body 32. The two wings 34 extend from two opposite sides of the inverted T-shaped body 32 with a predetermined distance from a first end 322 of the inverted T-shaped body 32 to an opposite second end 324 of the inverted T-shaped body 32.

The elastic section 40 is a rectangular-strip metallic sheet. The elastic section 40 includes a first connecting section 44, a second connecting section 45 connected to the first connecting section 44 by a first bending section 41, an abutting section 46 connected to the second connecting section 45 by a second bending section 42, and a tailing section 48 connected to the abutting section 46 by a third bending sections 43.

Figure 3:
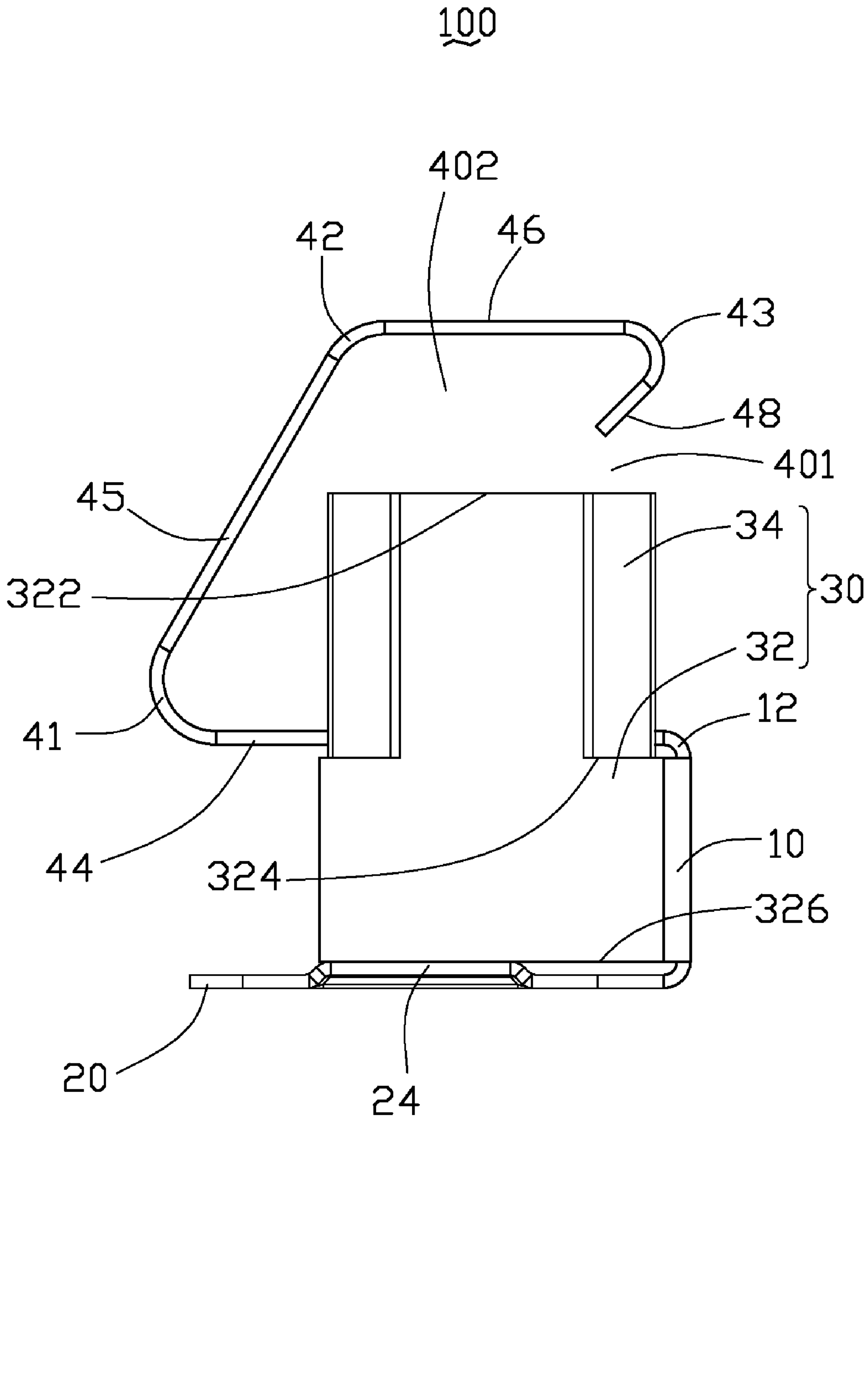
FIG. 3 is a lateral schematic view of the elastic sheet structure shown in FIG. 1.

A lateral schematic view of the elastic sheet structure 100 is shown in FIG. 3. The body section 10 is perpendicular to the fixing section 20. The two support sections 30 substantially perpendicularly connects to two opposite sides of the body section 10. The two support sections 30 are higher than the body section 10 concurrently with respect to the fixing section 20. A bottom end 326 of the inverted T-shaped body 32 of the support section 30 abuts against the bulges 24 of the fixing section 20 so that each support sections 30 is supported by the fixing section 20. The two wings 34 of the support section 30 are respectively bent with a given angle with respect to the inverted T-shaped body 32. An internal space 402 cooperatively defined by the support sections 30 and the body section 10 is turned to be bigger if the bent angle between the wings 34 and the inverted T-shaped body 32 is increased. The elastic section 40 is perpendicularly connected to the body section 10 so that a portion of the elastic section is substantially parallel to the fixing section 20. The elastic section 40 is located between and movable with respect to the two support sections 30. As shown in FIG. 3, a top of the elastic section 40 is higher than a top of each support section 30 concurrently with respect to the fixing section 20.

During a bending process of the elastic sheet structure 100, the elastic section 40 is bent for four times so as to implement the elastic sheet structure 100. Firstly, one end of the first connecting section 44 is vertically bent such that the first connecting section 44 is substantially parallel to the fixing section 20. Secondly, the second connecting section 45 is bent upward and toward the internal space 402 until the first connecting section 44 and the second connection section 45 constitute an acute angle. Thirdly, the abutting section 46 is downward bended to be substantially parallel to the first connecting section 44. Lastly, the tailing section 48, the shortest portion of the elastic section 40, is bent toward the internal space 402 of the elastic sheet structure. As a result, the first connecting section 44, the second connecting section 45, the abutting section 46 and the tailing section 48 are configured to be a C-shaped structure and an opening 401 is defined between the first connecting section 44 and the tailing section 48. Such design prevents the tailing portion 48 from being hooked by other members. As shown in FIG. 3, the three bending sections 41, 42, 43 are respectively arranged between the first connecting section 44, the second connecting section 45, the abutting section 46 and the tailing section 48 to accomplish the structure of the elastic section 40.

Figure 4:
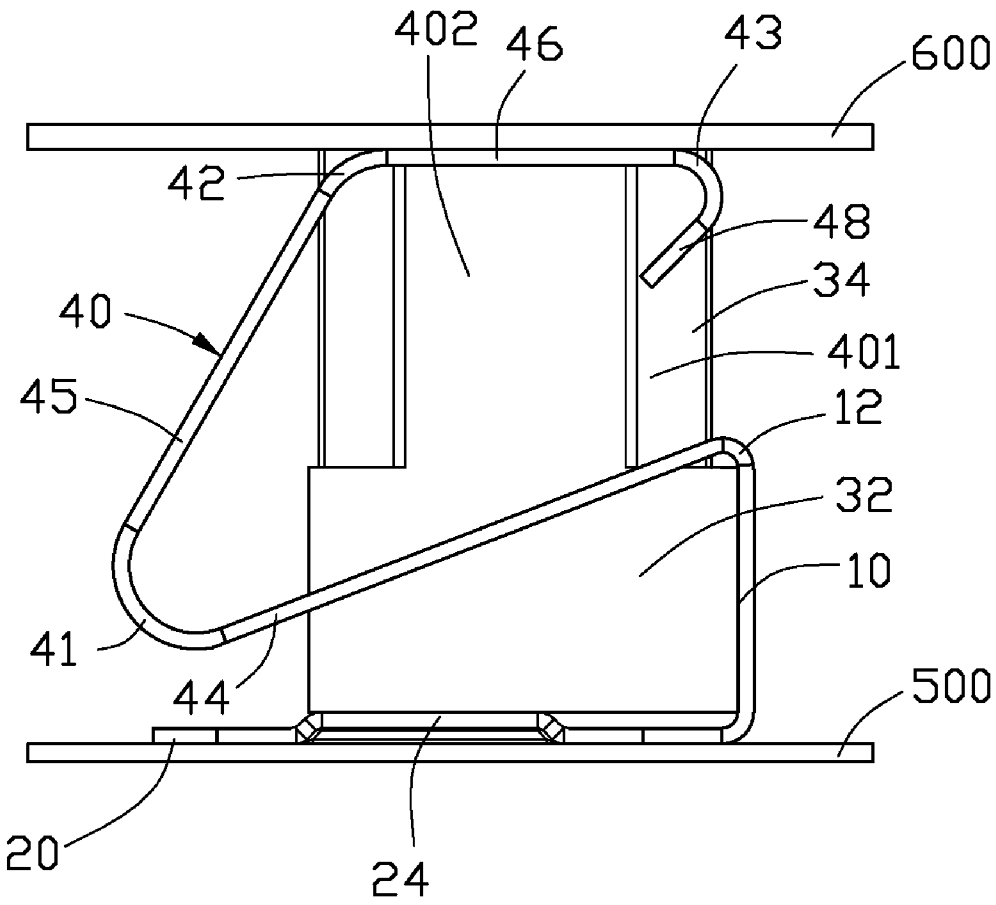
FIG. 4 is a lateral schematic view of the elastic sheet structure when it is pressed.

Referring to FIG. 4, the elastic sheet structure 100 is arranged between a circuit board 500 and a pressing member 600 so as to provide electrical connection therebetween. For illustration, one of the support sections 30 is taken away from the elastic sheet structure 100 in FIG. 4 so that the internal arrangement of the elastic sheet structure 100 can be clearly seen. When the pressing member 600 is pressed downwardly together with the elastic section 40, the abutting section 46 of the elastic section 40 elastically abuts against the pressing member 600. The internal space 402 of the elastic section 40 becomes smaller and elastic deformation occurs between the first connecting section 44 and the second connecting section 45. The pressing member 600 may be supported by the two support section 30 after it has been pressed downward to a predetermined distance. In addition, the wings 34 arranged on each of the support section 30 provides higher stability for supporting the pressing member 600 so as to prevent the elastic section 40 from unrecoverable deformation caused by over-pressed, and thus the elasticity of the elastic section 40 is ensured. The two support sections 30 will not be bent or broken because the bulges 24 formed at two sides of the fixing section 20 provide elastic support for the two support sections 30. Therefore, the stable and endurable structure is provided.

Figure 5:
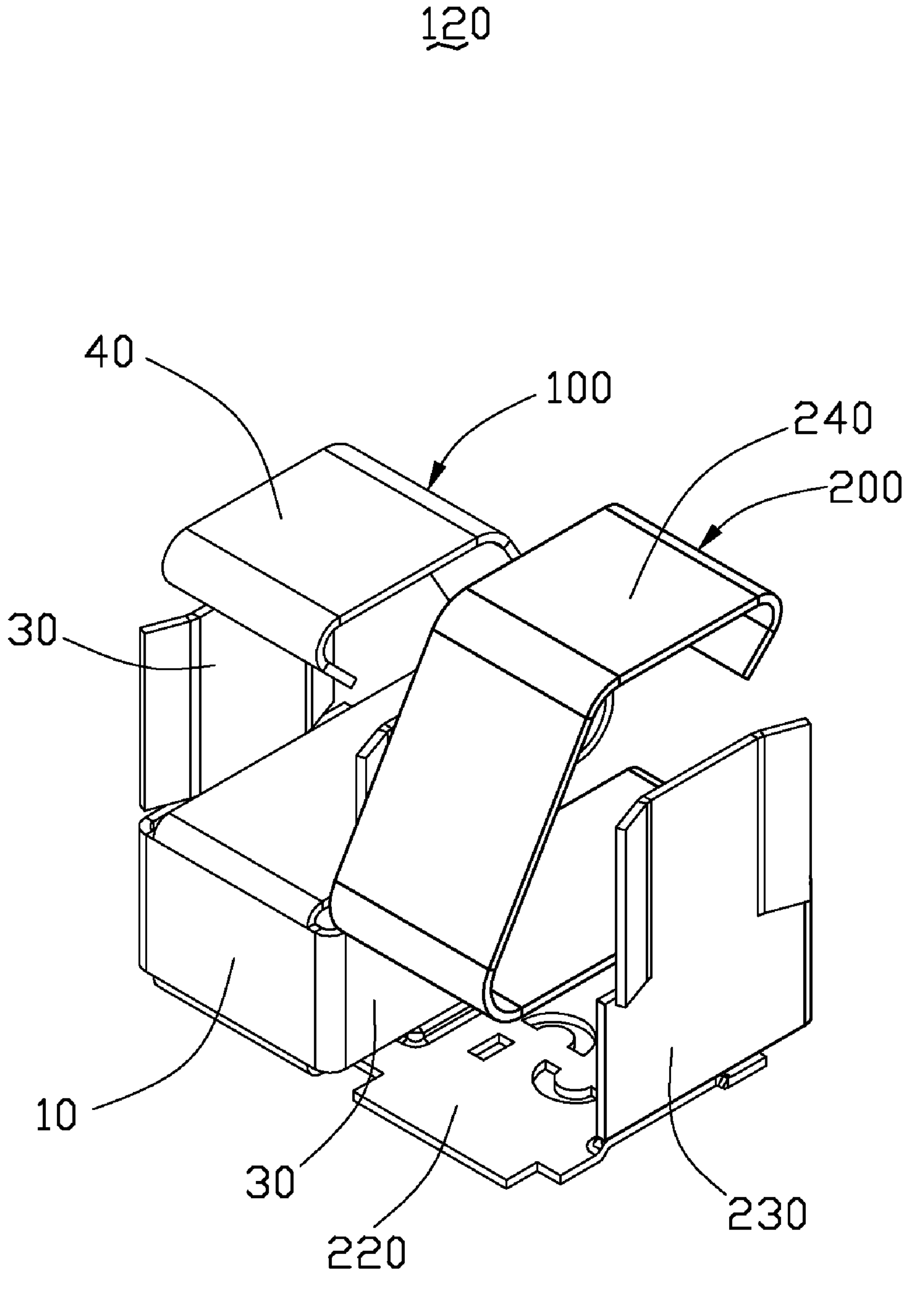
FIG. 5 is a perspective schematic view of an array type elastic sheet device according to another embodiment.
Figure 6:
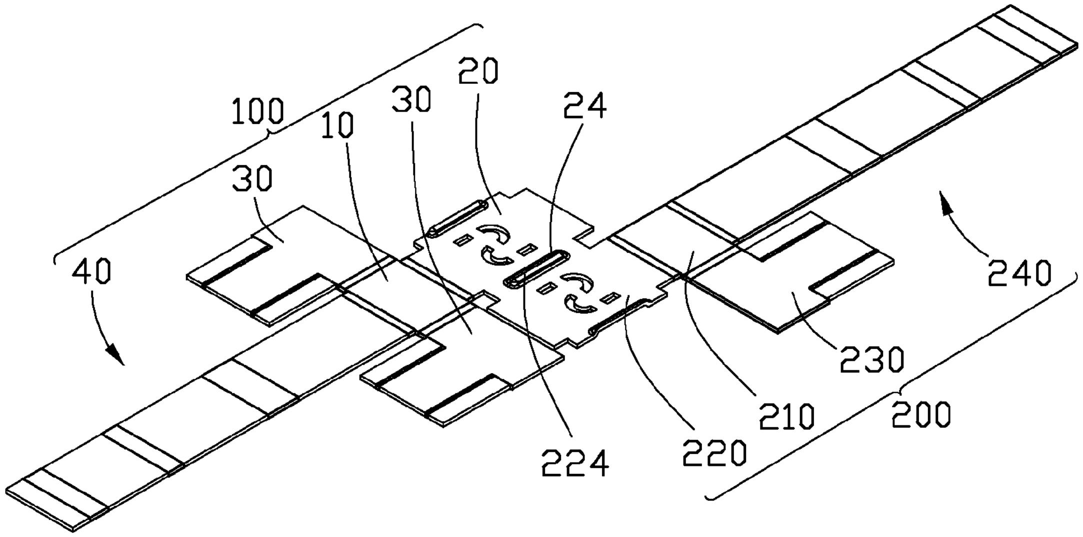
FIG. 6 is a stretched-out schematic view of the array type elastic sheet device of FIG. 5 before it is bent to a finalized shape.

FIGS. 5 and 6 show an array type elastic sheet device 120 according to a second preferred embodiment and a stretched-out, semi-finalized product view thereof. The array type elastic sheet device 120 includes the elastic sheet structure 100 and a first connecting-sheet structure 200 integrally formed with the elastic sheet structure 100. The array type elastic sheet device 120 is also formed by punching and bending a sheet of metallic material. FIG. 6 is the stretched-out view of FIG. 5, before the array type elastic sheet device 120 is bent to its finalized shape. The first connecting-sheet structure 200 includes a body section 210, a fixing section 220, a support section 230 and an elastic section 240. The shape and arrangement of the first connecting-sheet structure 200 in the present embodiment are nearly the same as the elastic sheet structure 100 mentioned above except that the first connecting-sheet structure 200 has only one support section 230. The fixing section 220 of the first connecting-sheet structure 200 is integrally formed with the fixing section 20 of the elastic sheet structure 100. In addition, as shown in FIG. 6, the elastic section 40 of the elastic sheet structure 100 and the elastic section 240 of the first connecting-sheet structure 200 are symmetrically disposed on two sides of the fixing section 20, 220.

The method for punching and bending the first connecting-sheet structure 200 is approximately similar to that for the elastic sheet structure 100. The body section 10 of the elastic sheet structure 100 and the body section 210 of the first connecting-sheet structure 200 are respectively located at opposite sides of the fixing section 220 of the first connecting-sheet structure 200 and the fixing section 20 of the elastic sheet structure 100. In addition, the bending direction of the elastic section 240 is opposite to that of the elastic section 40. As shown in FIG. 5, the abutting section of the elastic section 40 and that of the elastic section 240 protrude out from support sections 30, 230 and both of the elastic sections 40, 240 align with each other horizontally. Similar to FIG. 4, the array type elastic sheet device 120 may be arranged between the circuit board 500 and the pressing member 600 and subject to a depression by the pressing member 600. When the pressing member 600 is depressed, the two elastic sections 40 and 240 respectively abut the pressing member 600 so as to provide multi-contact thereto and to ensure the stability of the electrical connections.

Figure 7:
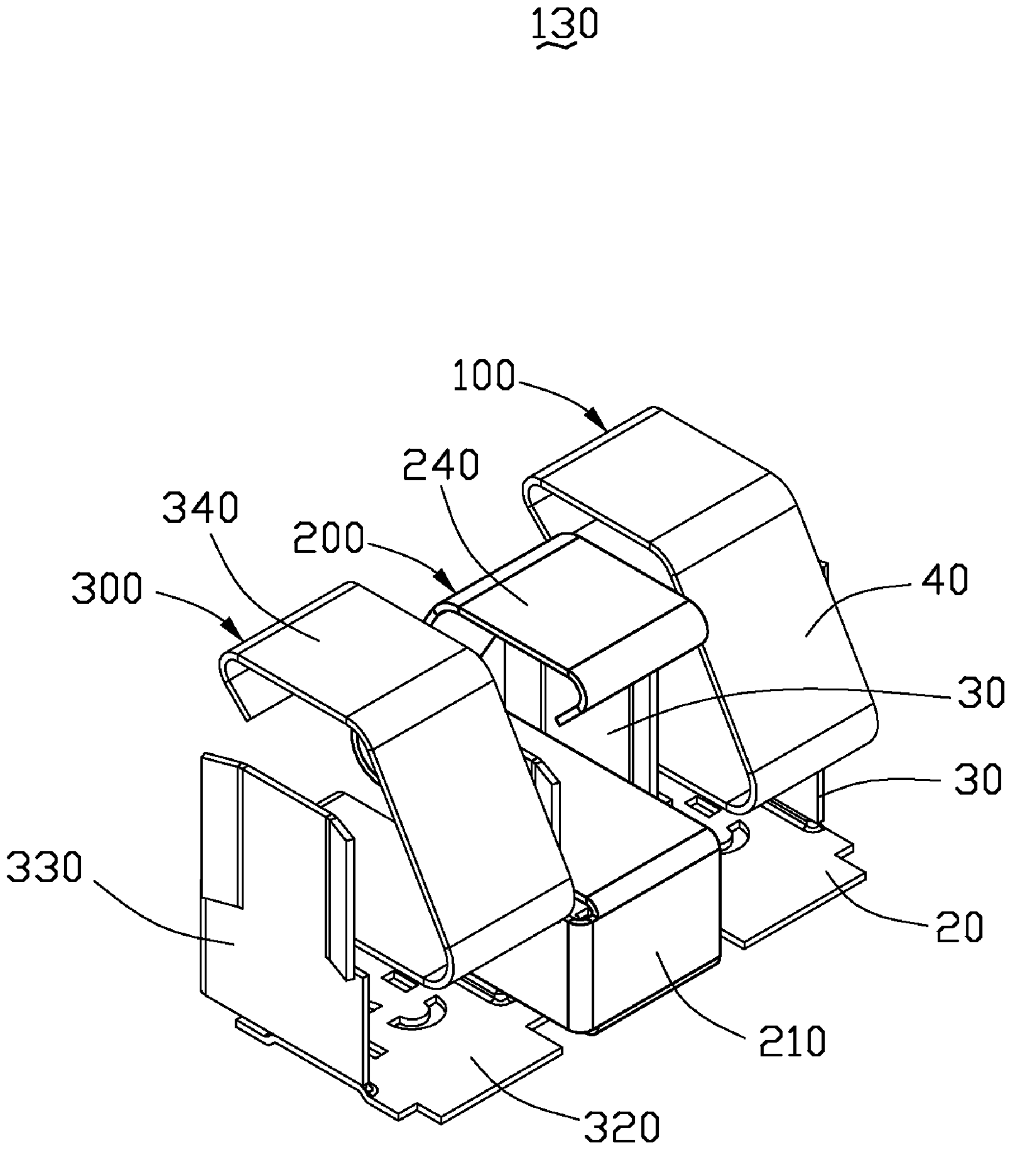
FIG. 7 is a perspective schematic view of an array type elastic sheet device according to another embodiment.
Figure 8:
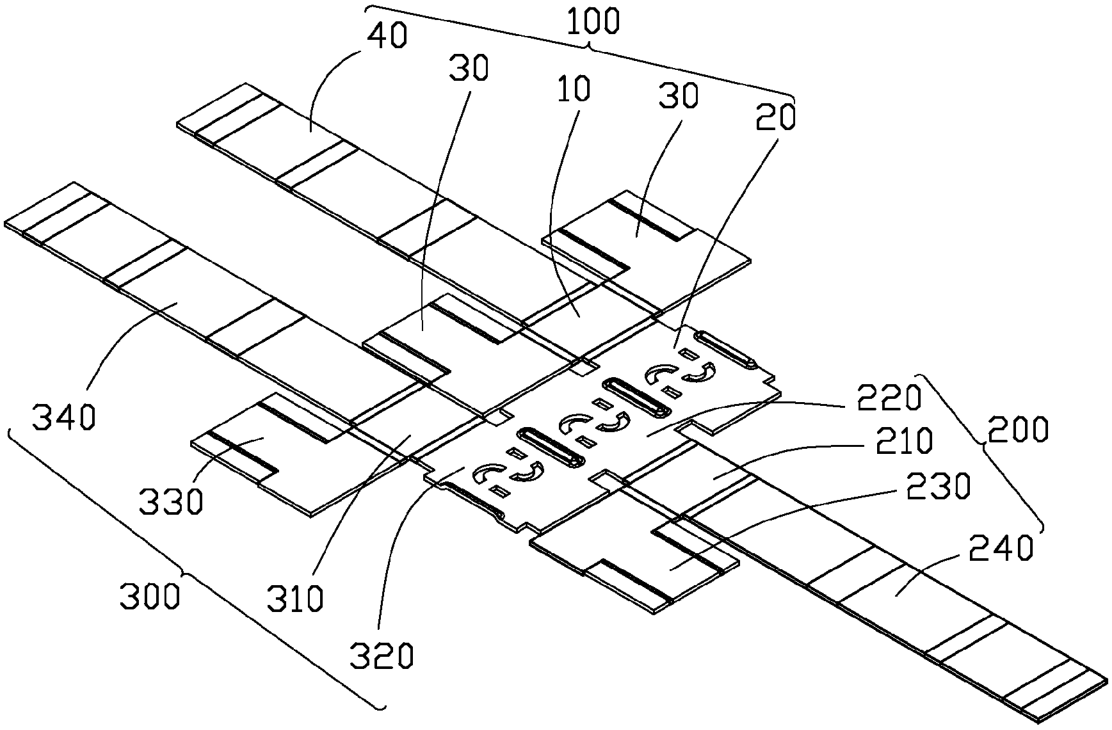
FIG. 8 is a stretched-out schematic view of the array type elastic sheet device of FIG. 7 before it is bent to a finalized shape.

FIGS. 7 and 8 show an array type elastic sheet device 130 according to a third embodiment and a stretched-out, semi-finalized product view thereof. The array type elastic sheet device 130 includes the elastic sheet structure 100, a first connecting-sheet structure 200 and a second connecting-sheet structure 300. The shape and arrangement of the second connecting-sheet structure 300 in the present embodiment are the same as the first connecting-sheet structure 200.

Referring to FIG. 8, the second connecting-sheet structure 300 includes a body section 310, a fixing section 320, a support section 330 and an elastic section 340. The elastic sheet structure 100, the first connecting-sheet structure 200 and the second connecting-sheet structure 300 are integrally formed successively via three fixing sections 20, 220, 320 thereof. A stretching direction of the elastic section 340 of the second connecting-sheet structure 300 is the same with that of the elastic sheet structure 100. In the other words, the stretching direction of the elastic section of the elastic sheet structure is opposite to that of the adjacent connecting-sheet structures, i.e., the first connecting-sheet structure 200 and the second connecting-sheet structure 300.

Referring to FIG. 7, the array type elastic sheet device 130 is formed by bending and punching the elastic sheet structure 100, the first connecting-sheet structure 200 and the second connecting-sheet structure 300 with similar bending method as stated above. After the array type elastic sheet device 130 is bended to its finalized shape, each support sections 30, 230, 330 is substantially perpendicular to corresponding fixing sections 20, 220, 320. Each two support sections 30, 230, 330 are higher than the corresponding body sections 10, 20, 30 concurrently with respect to the corresponding fixing sections 20, 220, 320. Each of the elastic sections 40, 240, 340 is substantially perpendicularly connected to the corresponding body sections 10, 20, 30 so that a portion of the elastic sections 20, 220, 320 are substantially parallel to the corresponding fixing sections 20, 220, 320. Each of the elastic sections 40, 240, 340 is respectively located between and movable with respect to the corresponding two support sections 30, 230, 330, and the openings (not labeled) of the adjacent elastic sections 40, 240, 340 is opposite to each other. Tops of the elastic sections 40, 240, 340 are higher than tops of each support sections 30, 230, 330 concurrently with respect to the fixing sections 20, 220, 320.

Figure 9:
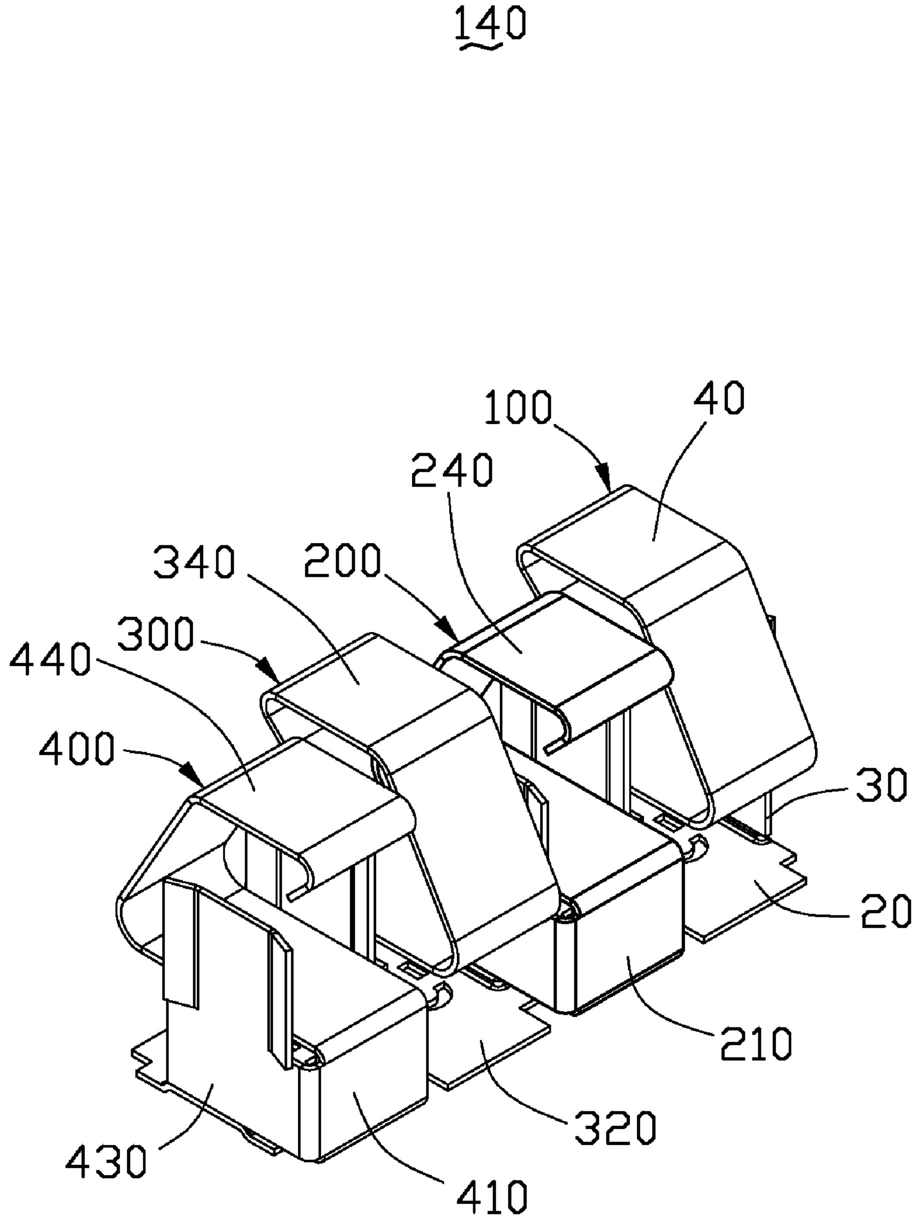
FIG. 9 is a perspective schematic view of an array type elastic sheet device according to another embodiment.
Figure 10:
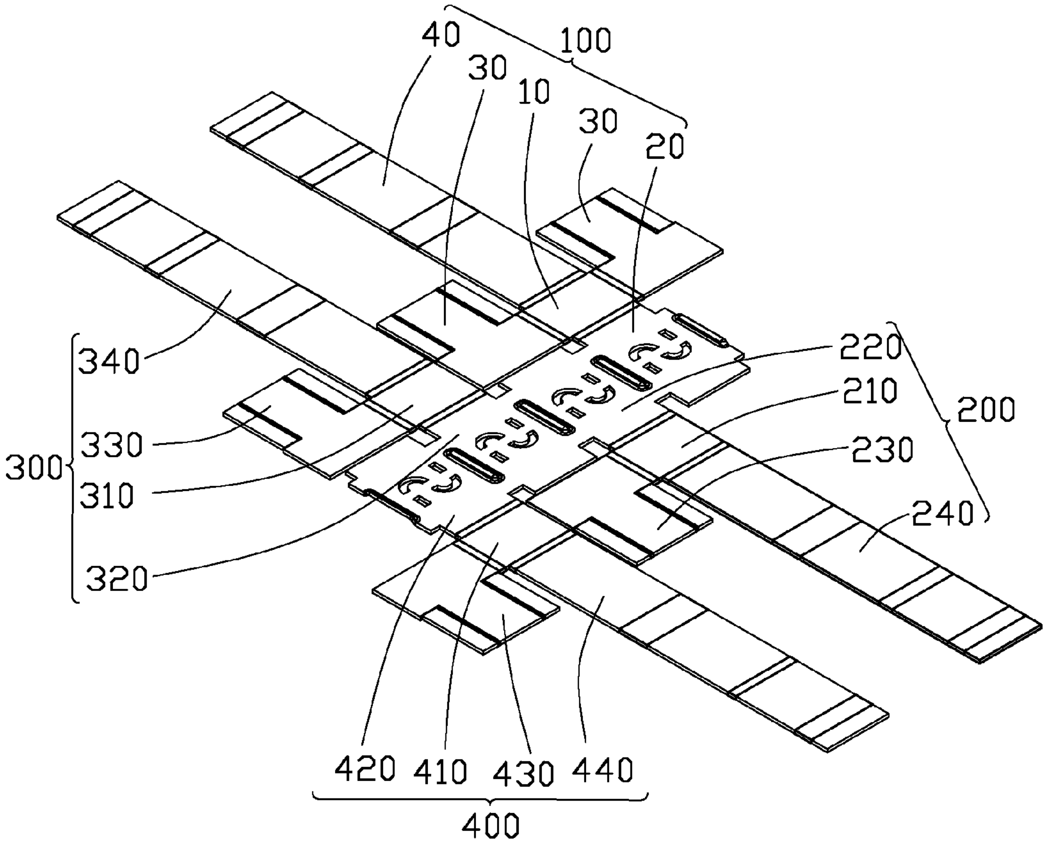
FIG. 10 is a stretched-out schematic view of the array type elastic sheet device of FIG. 9 before it is bent to a finalized shape.

FIGS. 9 and 10 show an array type elastic sheet device 140 according to a fourth preferred embodiment and a stretched-out, semi-finalized product view thereof. The array type elastic sheet device 140 includes the elastic sheet structure 100, a first connecting-sheet structure 200, a second connecting-sheet structure 300 and a third connecting-sheet structure 400. The shape and arrangement of the third connecting-sheet structure 400 in the present embodiment are the same as the first connecting-sheet structure 200 and the second connecting-sheet structure 300 structure.

Referring to FIG. 10, the third connecting-sheet structure 400 includes a body section 410, a fixing section 420, a support section 430 and an elastic section 440. The elastic sheet structure 100, the first connecting-sheet structure 200, the second connecting-sheet structure 300, the third connecting-sheet structure 400 are integrally formed successively via four fixing sections 20, 220, 320, 420 thereof. Refer to FIG. 9, the array type elastic sheet device 140 is formed by bending and punching the elastic sheet structure 100, the first connecting-sheet structure 200, the second connecting-sheet structure 300 and the third connecting-sheet structure 400 with similar bending method as stated above.

In view of the above, the array type elastic sheet device 120, 130, 140 may be manufactured from the elastic sheet structure 100 and a plurality of connecting-sheet structures 200, 300, 400. Each of the fixing section 20, 220, 320, 420 abuts with each other. Each two support sections 30, 230, 330, 430 is substantially perpendicular to corresponding fixing sections 20, 220, 320, 420. Each of the elastic sections 40, 240, 340, 440 is substantially perpendicularly connected to the corresponding body sections 10, 20, 30, 40 so that a portion of the elastic sections 20, 220, 320, 420 are substantially parallel to the corresponding fixing sections 20, 220, 320, 420. Each of the elastic sections 40, 240, 340 is respectively located between and movable with respect to the corresponding two support sections 30, 230, 330, 430, and the openings (not labeled) of the adjacent elastic sections 40, 240, 340, 440 is opposite to each other. Tops of the elastic sections 40, 240, 340, 440 are higher than tops of each support sections 30, 230, 330, 430 concurrently with respect to the fixing sections 20, 220, 320, 420.

Figure 11:
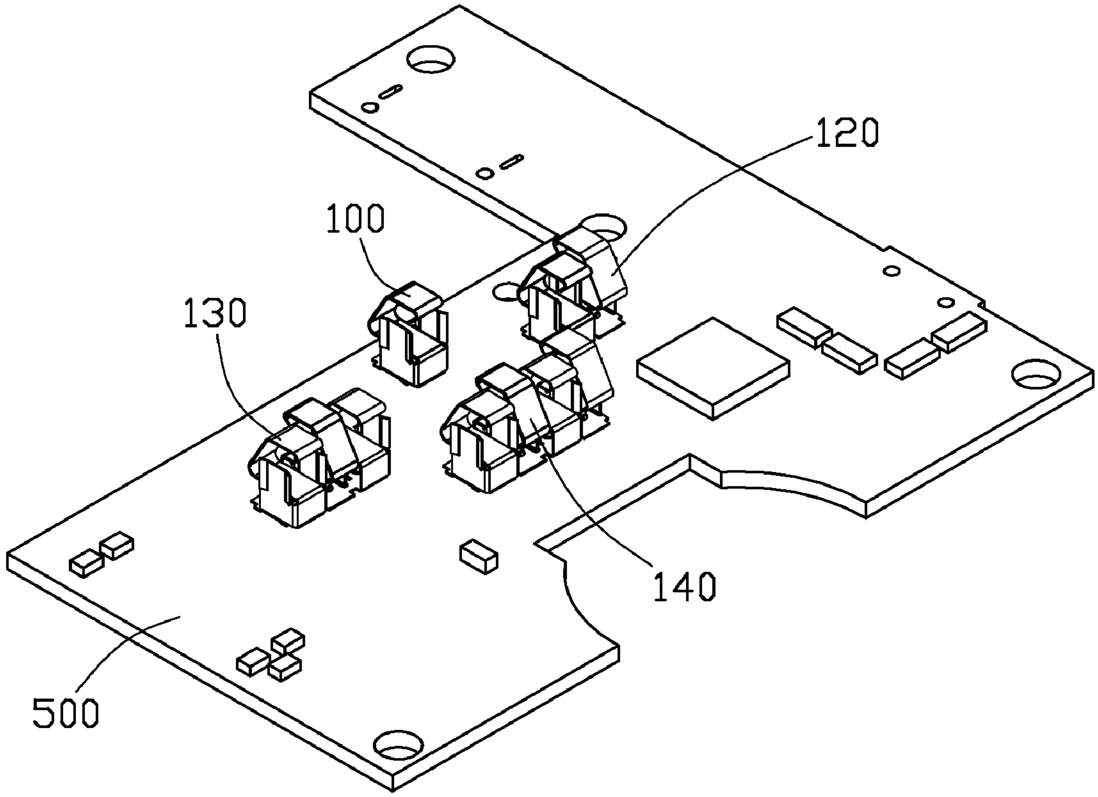
FIG. 11 is a perspective schematic view of a circuit board and the elastic sheet structure and a plurality of array type elastic sheet devices that are arranged thereon according to a preferred embodiment.

Referring to FIG. 11, the elastic sheet structure 100 and the array type elastic sheet devices 120, 130, 140 are arranged on the circuit board 500. The multi-contact requirement of the circuit board can be achieved by arranging the elastic sheet structure 100 and/or the array type elastic sheet devices 120, 130, 140 in various locations on the circuit board.

In view of the above, the wings arranged on each of the support sections provide higher stability for supporting the pressing member 600 so as to prevent the elastic sections 40, 240, 340, 440 from unrecoverable deformation caused by over-pressed. Thus, the elasticity of the elastic sections 40, 240, 340, 440 is ensured. In addition, the manufacturing process of the array type elastic sheet devices 120, 130, 140 incorporated the elastic sheet structure 100 is quite simple. As the array type elastic sheet devices 120, 130, 140 include a plurality of elastic sections 40, 240, 340, 440 for abutting against the pressing member 600 simultaneous, the multi-contact requirement of the circuit board 500 and pressing member 600 can be achieved thereby providing the stability of the electrical connections.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An array type elastic sheet device comprising:

a plurality of fixing sections integrally connected in a unit, forming a strip-plank structure;

a plurality of body sections, each of the body sections perpendicularly connected to a side of a corresponding fixing section;

a plurality of elastic sections, each of the elastic sections perpendicularly connected to an upper side of the corresponding body section so that a portion of each elastic section is substantially parallel to the corresponding fixing section;

a plurality of support sections, each two support sections perpendicularly and directly connected to two opposite lateral sides of the corresponding body section, the each two support sections being higher than the corresponding body section concurrently with respect to the corresponding fixing section and each two support sections being supported by the corresponding fixing section; and wherein each elastic sections is located between and movable upwardly or downwardly with respect to the corresponding two support sections, and a top of each elastic section is higher than a top of the corresponding support section concurrently with respect to the fixing section.

2. The array type elastic sheet device of claim 1, wherein each of the fixing section includes two bulges arranged thereon for supporting corresponding two support sections.

3. The array type elastic sheet device of claim 1, wherein each of the fixing section defines fixing slots therein, and the array type elastic sheet is fixed onto other electrical components by the fixing slots.

4. The array type elastic sheet device of claim 1, wherein each of the support section includes an inverted T-shaped body and two wings integrally formed with the inverted T-shaped body, and the support section is substantially rectangular-shaped.

5. The array type elastic sheet device of claim 4, wherein the two wings of the support section extend from two opposite sides of the inverted T-shaped body, and are respectively bent with a given angle with respect to the corresponding inverted T-shaped body.

6. The array type elastic sheet device of claim 1, wherein the body section includes a rectangular body and bending edges extend from four edges of the rectangular body, the body section connects with the fixing section, two support sections and the elastic section by the bending edges.

7. The array type elastic sheet device of claim 6, wherein each of the elastic section includes a first connecting section, a second connecting section connected to the first connecting section by a first bending section, an abutting section connected to the second connecting section by a second bending section, a tailing section connected to the abutting section by a third bending sections, and the first connecting section, the second section, the abutting section and the tailing section are arc-connected by the first, second and third bending sections to form a C-shaped structure.

8. The array type elastic sheet device of claim 7, wherein each of the first connecting section connects the body section by one of the bending edge.

9. The array type elastic sheet device of claim 7, wherein the tailing section is shorter than the first connecting section, the second connecting and the abutting section.

* * * * *